(12) United States Patent
Mallikarjunaswamy

(10) Patent No.: US 9,437,673 B2
(45) Date of Patent: Sep. 6, 2016

(54) FLOATING GUARD RING FOR HV INTERCONNECT

(71) Applicant: Alpha and Omega Semiconductor Incorporated, Sunnyvale, CA (US)

(72) Inventor: Shekar Mallikarjunaswamy, San Jose, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 96 days.

(21) Appl. No.: 14/173,692

(22) Filed: Feb. 5, 2014

(65) Prior Publication Data

US 2015/0221720 A1 Aug. 6, 2015

(51) Int. Cl.
| | | |
|---|---|---|
| *H01L 29/49* | (2006.01) | |
| *H01L 29/06* | (2006.01) | |
| *H01L 27/06* | (2006.01) | |
| *H01L 27/088* | (2006.01) | |
| *H01L 29/78* | (2006.01) | |
| *H01L 21/8238* | (2006.01) | |
| *H01L 21/761* | (2006.01) | |

(Continued)

(52) U.S. Cl.
CPC ....... *H01L 29/0619* (2013.01); *H01L 27/0623* (2013.01); *H01L 27/088* (2013.01); *H01L 29/7835* (2013.01); *H01L 21/761* (2013.01); *H01L 21/823878* (2013.01); *H01L 21/823892* (2013.01); *H01L 27/092* (2013.01); *H01L 29/063* (2013.01); *H01L 29/407* (2013.01)

(58) Field of Classification Search
CPC ........... H01L 29/0619; H01L 27/0623; H01L 27/088; H01L 29/7835
See application file for complete search history.

(56) References Cited

U.S. PATENT DOCUMENTS

| 7,746,125 B2 | 6/2010 | Storms et al. | |
|---|---|---|---|
| 2008/0074165 A1* | 3/2008 | Jeon | H01L 27/0629 327/333 |

(Continued)

OTHER PUBLICATIONS

Co-Pending U.S. Appl. No. 13/801,723 to Shekar Mallikarjunaswamy, entitled "Active ESD Protection Circuit", filed Mar. 13, 2013.

(Continued)

*Primary Examiner* — Michael Shingleton
(74) *Attorney, Agent, or Firm* — Joshua D. Isenberg; JDI Patent

(57) ABSTRACT

Aspects of the present disclosure describe an integrated circuit comprises a substrate of a first conductivity type semiconductor, a lightly doped semiconductor layer of the first conductivity type semiconductor disposed over the substrate, a driver circuit, an electrically conductive interconnect structure formed over the semiconductor layer and electrically connected to the driver circuit at one end, at least one guard structure formed in the semiconductor layer and under the interconnect structure and a well region of the first conductivity type semiconductor formed in a top portion of the semiconductor layer, between the driver circuit and the at least one guard structure and under the interconnect structure. The guard structure is electrically floating. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

20 Claims, 7 Drawing Sheets

(51) Int. Cl.
*H01L 27/092* (2006.01)
*H01L 29/40* (2006.01)

(56) References Cited

U.S. PATENT DOCUMENTS

2012/0126322 A1* 5/2012 Ko .................. H01L 21/76202
257/339
2014/0049293 A1 2/2014 Mallikarjunaswamy

OTHER PUBLICATIONS

International Rectifier High and Low Side Driver Data Sheet IRS2101(S)PbF, Nov. 27, 2006.
Fairchild FAN7382 High- and Low-Side Gate DRiver Data Sheet, 2005.
International Rectifier Application Note AN-978, "HV Floating MOS-Gate Driver ICs," Mar. 23, 2007.
Moon, Nam-Chil, et al. "Design and optimization of 700V HVIC technology with multi-ring isolation structure." Power Semiconductor Devices and ICs (ISPSD), 2013 25th International Symposium on. IEEE, 2013.

* cited by examiner

FLOATING GUARD RING FOR HV INTERCONNECT

FIELD OF THE INVENTION

This invention generally relates to semiconductor devices. More particularly, this invention relates to device structures for high voltage integrated circuits.

BACKGROUND OF THE INVENTION

In recent years, smart power technologies have gained more importance. Smart power technologies offer the integration of analog and digital circuit (e.g., bipolar and CMOS devices) combined with the power stage (e.g., DMOS devices) on a single chip. As such, smart power technologies provide more features to choose among high density lower power consumption of CMOS, high power drive capability and high speed of bipolar, and large current and high breakdown voltage of DMOS. The combination of multiple functions (including analog, digital and power) on a single chip enables miniature system design for different applications in the fields of automotive, industrial, telecommunication and electronic data process. In addition, smart power technologies include diagnostic and protection functions to the power transistors, which increase the robustness and reliability of power driver for various applications.

Today's smart power applications require gate drivers to drive power transistors (such as MOSFET or IGBT) in the range of 50-1200V. The key issue for high voltage is the design of the power device and the process of integrating it with low voltage devices. FIG. 1A is a top view of a conventional high voltage gate driver integrated circuit and FIG. 1B is a cross-sectional view of the conventional high voltage gate driver integrated circuit of FIG. 1A. Referring to FIGS. 1A and 1B, a high voltage gate driver integrated circuit 10 typically includes a low voltage circuit region 12 and a high voltage circuit region 14 inside a high voltage floating tub. In the present description, the term "high voltage circuit region" refers to a circuit region of low voltage circuits that are sitting inside a high voltage floating tub that encompasses the high voltage circuit region 14. The floating tub includes a RESURF region 11 that terminates a high voltage circuit region. A resistor inside the high voltage floating tub determines the voltage that triggers the control circuitry that turns on the high side power transistor. A junction termination region 16 is disposed between the low voltage region 12 and the high voltage floating tub 11. The junction termination region 16 provides an electrical isolation between the low voltage circuit region 12 and the high voltage circuit region 14. A level shifter 18, such as one or more N-type lateral double-diffused MOS (LDMOS) transistors, are disposed in the low voltage region 12 for level-shifting a signal voltage referenced to ground to a signal voltage referenced to the high voltage floating tub. The level shifter 18 is formed inside an N-buried layer and grounded to the p-type substrate. The level shifter 18 may be a lateral LDMOS made using a N– drain region. A source of the LDMOS can be isolated inside the N-drain region or may sit directly in P-type substrate.

The level shifter 18 and the high voltage circuit region 14 are electrically connected by metal 13. The metal 13 connects the drain of the level shifter 18 and crosses the junction isolation 16 to connect to the high voltage circuitry in the high voltage circuit region 14. Since the metal 13 is connected to high voltage (such as 600V), this can cause high electric field in silicon under the metal 13 and causing snapback and breakdown degradation. Alternatively, the level-shifting device (LDMOS) may be merged into the high voltage circuit region to avoid breakdown degradation due to metal crossing. However, the leakage current between LDMOS drain and high voltage circuit region becomes an issue. The high voltage gate driver integrated circuit 10 also employs N-type buried layer structure 19 formed between the P-type substrate 17 and the N-type epitaxial layer 20. The N-type buried layer 19 (NBL) is formed in both the high voltage circuit region 14 and the low voltage circuit region 12 to reduce parasitic PNP conduction and prevent latch-up. Buried layers require additional processing steps in the fabrication of the high voltage gate driver integrated circuit and thus increase the cost of manufacturing.

FIG. 2A is a cross-sectional view of a conventional high voltage gate driver integrated circuit built using P-epi with lower spacing between high side tub and the substrate pick-up. FIG. 2B is a cross-sectional view of a conventional high voltage gate driver integrated circuit with an adjacent low voltage N-tub next to a high voltage N-tub. However, the depletion (as shown in dashed lines in FIGS. 2A and 2B) is under the high voltage interconnect and it causes high electric field in silicon under the interconnect. Also, the depletion curves and spreads under the p-well region causing PNP punch through in the situation depicted in FIG. 2B. In the situation shown in FIG. 2A, the depletion curvature results in high electric field, which causes snap-back.

It is within this context that embodiments of the present invention arise

DESCRIPTION OF THE SPECIFIC EMBODIMENTS

Figure 1A:
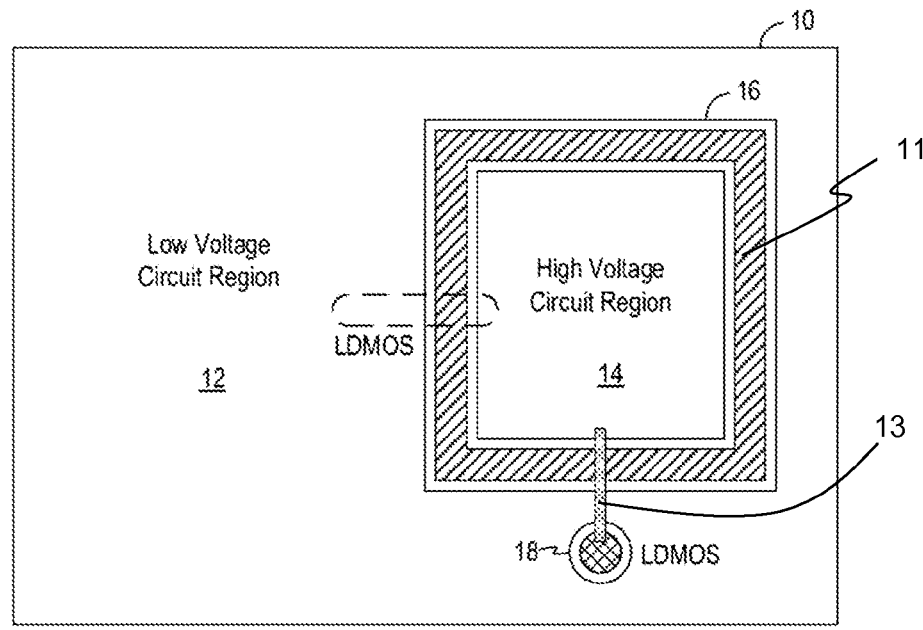
FIG. 1A is a top view of a conventional high voltage gate driver integrated circuit.
Figure 1B:
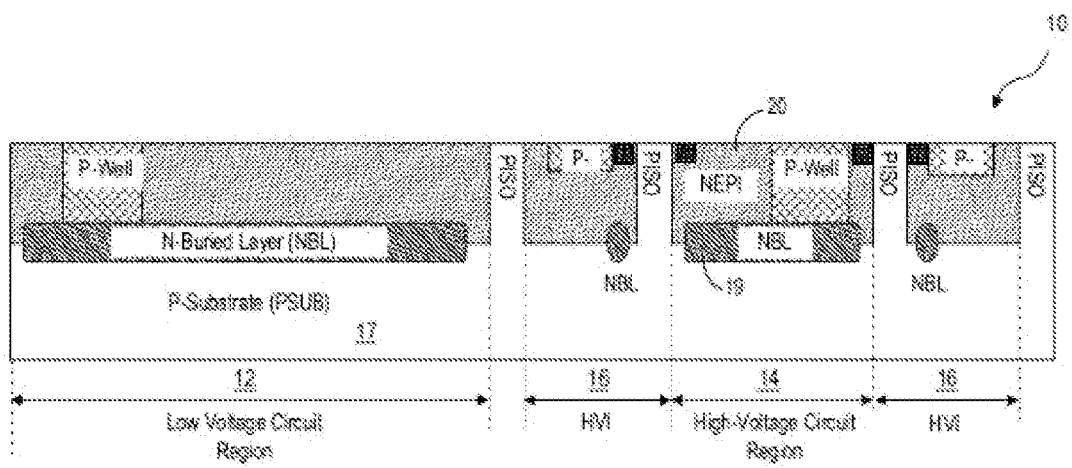
FIG. 1B is a cross-sectional view of the conventional high voltage gate driver integrated circuit of FIG. 1A.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following detailed description, reference is made to the accompanying drawings, which form a part hereof, and in which is shown by way of illustration specific embodiments in which the invention may be practiced. In this regard, directional terminology, such as "top," "bottom," "under," "between," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. that are within the recited limits.

In much of the following discussion, the first conductivity type is typically P and the second conductivity type is N. However, it should be noted that substantially similar devices may be fabricated using a similar process but with opposite conductivity types.

According to one embodiment of the present disclosure, an integrated circuit comprises a substrate of a first conductivity type semiconductor, a lightly doped semiconductor layer of the first conductivity type semiconductor disposed over the substrate, a driver circuit, an electrically conductive interconnect structure formed over the semiconductor layer and electrically connected to the driver circuit at one end, at least one guard structure formed in the semiconductor layer and under the interconnect structure and a well region of the first conductivity type semiconductor formed in a top portion of the semiconductor layer, between the driver circuit and the at least one guard structure and under the interconnect structure. The guard structure is electrically floating.

According to another embodiment of the present disclosure, an integrated circuit comprises a substrate of a first conductivity type semiconductor, a lightly doped semiconductor layer of the first conductivity type semiconductor disposed over the substrate, a driver circuit, and a level shifter including a drain region. The drain region of the level shifter is electrically connected to the driver circuit by an electrically conductive interconnect structure. The integrated circuit also comprises at least one guard structure formed in the semiconductor layer between the driver circuit and the level shifter and under the interconnect structure. The guard structure is electrically floating.

Figure 3:
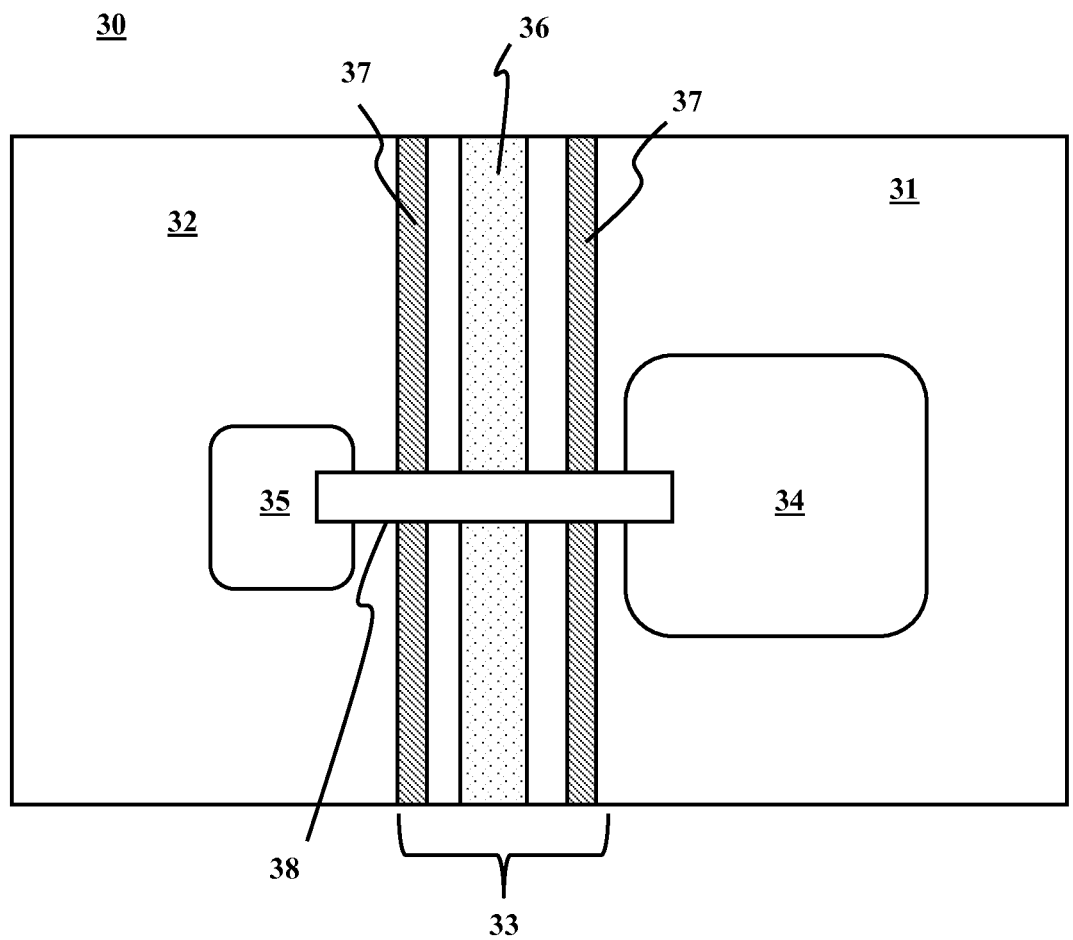
FIG. 3 is a top view of a high voltage integrated circuit in accordance with one embodiment of the present disclosure.

FIG. 3 is a top view of a high voltage integrated circuit in accordance with one embodiment of the present disclosure. The high voltage integrated circuit 30 includes a high voltage circuit region 31 and a low voltage circuit region 32. A junction termination region 33 is disposed between the high voltage region 31 and the low voltage region 32, and electrically isolated the high voltage circuit region from the low voltage circuit region. A driver circuit 34 is located in the high voltage circuit region 31. The drive circuit 34 may include circuit to drive power transistor (such as MOSFET or IGBT) in a range, e.g., from about 3.3 volts to about 30 volts. In one embodiment, a level-shifter 35 is located in the low circuit region 32. In some implementations, the level shifter could be located in the junction termination region 33, which can also act as a drain region of the level shifter 35. The level-shifter 35 level shifts a signal from the low voltage circuit region 32 and provides it to the driver circuit 34. In one example, the level-shifter 35 is a laterally diffused metal oxide semiconductor (LDMOS) transistor device. As known in the art, LDMOS transistor devices with a reduced surface field may have a high breakdown voltage greater than 600 volts. A junction termination region 33 may include two high voltage well regions 37 and a guard structure 36 therebetween as shown in FIG. 3. The interconnect structure 38 is electrically coupled to the driver circuit 34 on one end and to the level-shifter 35 on the other end.

Figure 4:
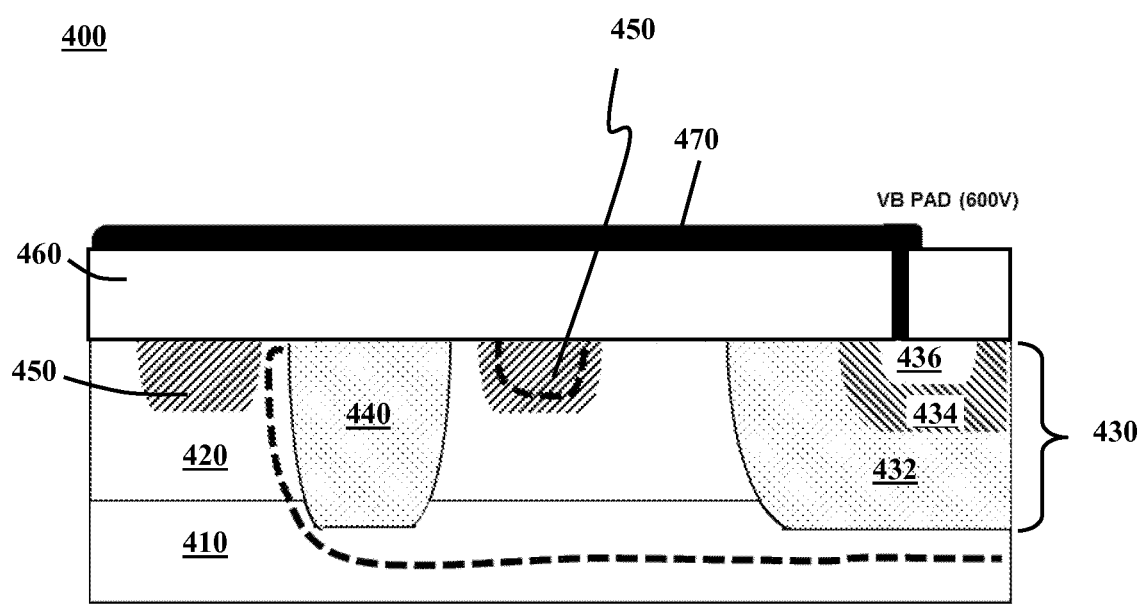
FIG. 4 is a cross-sectional view of a high voltage integrated circuit in accordance with one embodiment of the present disclosure.

FIG. 4 is a partial cross-sectional view of FIG. 3 in accordance with one embodiment of the present disclosure. The integrated circuit 400 includes a substrate 410 of a first conductivity type semiconductor (e.g., P substrate). The substrate 400 may be doped with a P-type dopant such as boron. In another embodiment, the substrate may be doped with an N-type dopant, such as phosphorous or arsenic. An epitaxial layer 420 of the first conductivity type (e.g., P type epitaxial layer) is formed over the P-type substrate 410. In one example, the epitaxial layer 420 may be formed by an epitaxial growth process as known in the art. The epitaxial layer 420 is lightly doped and may have a doping concentration that is in a range from about $1 \times 10^{14}$ atoms/centimeter$^3$ to about $1 \times 10^{15}$ atoms/centimeter$^3$. The thickness of the epitaxial layer 420 may be in a range from about 10 to about 25 microns.

A driver circuit 430 is formed in the epitaxial layer 420. Specifically, the driver circuit 430 may include a deep well region 432 of the second conductivity type (e.g., N deep well) formed in the epitaxial layer 420. In one example, the deep well region 432 is formed by an ion implantation process known in the art. As an example, the deep well region 432 has a doping concentration that is in a range from about $1 \times 10^{15}$ atoms/centimeter$^3$ to about $5 \times 10^{16}$ atoms/centimeter$^3$. The deep well region 432 may extend vertically to reach the substrate 410. A high voltage doped well region 434 of the second conductivity type (e.g., high voltage N well) is formed in the deep well region 432. In one example, the high voltage doped well region 434 is formed by an ion implantation process known in the art. As an example, the high voltage doped well region 434 has a doping concentration that is in a range from about $2 \times 10^{15}$ atoms/centimeter$^3$ to about $2 \times 10^{16}$ atoms/centimeter$^3$. In addition, a heavily doped region 436 of the second conductivity type (e.g., N+ region) is formed in the high voltage doped well region 434. The heavily doped region 436 may be formed by an ion implantation process known in the art. As an example, the heavily doped region 436 has a doping concentration that is in a range from about $1 \times 10^{18}$ atoms/centimeter$^3$ to about $5 \times 10^{20}$ atoms/centimeter$^3$.

The driver circuit 430 is electrically connected to a level shifter (not shown), e.g., a LDMOS transistor device, by an interconnect structure 470. Specifically, the interconnect structure 470 is electrically coupled to the driver circuit 430 at one end and coupled to the drain region of a LDMOS transistor at the other end. The interconnect structure 470 is formed over an insulating layer 460 made from a dielectric material as an example. The interconnect structure 470 is made of an electrically conductive material. Examples of the interconnect structure 470 are aluminum interconnect lines, copper interconnect lines and may include aluminum, copper, aluminum alloy, copper alloy, aluminum/silicon/copper alloy, titanium, titanium nitride, tantalum, tantalum nitride, tungsten, polysilicon, metal silicide, or combinations thereof. The interconnect structure may be formed by a process including physical vapor deposition (PVD), chemical vapor deposition (CVD), sputtering, plating, or combinations thereof. The interconnect structure is generally at high voltage that ranges, e.g., from 120 volts to about 1200 volts.

A high-voltage junction termination region (e.g., the junction termination region 33 of FIG. 3) may include at least one high voltage doped well 450 of the first conductivity type (e.g., high voltage P well) and at least one guard structure 440. As shown in FIG. 4, two high voltage doped well region 450 are formed in a top portion of the epitaxial layer 420. At least one portion of the high voltage doped wells 450 are under the interconnect structure 470.

The two high-voltage doped wells 450 are connected to each other in the third dimension. In one example, the high voltage doped well regions 450 are formed by ion implantation process known in the art. The high voltage doped well regions 450 are doped with the same doping polarity as that of the substrate 410. As an example, the high voltage doped region 450 has a doping concentration that is in a range from about $1 \times 10^{16}$ atoms/centimeter$^3$ to about $5 \times 10^{16}$ atoms/centimeter$^3$. The width of each high voltage doped well 450 is about 10 µm. The high voltage doped well 450 that is near the driver circuit 430 is in a distance of about 50 µm from the driver circuit 430.

A guard structure 440 is formed in the epitaxial layer 420 and between the two high-voltage doped well regions 450. At least one portion of the guard structure 440 are under the interconnect structure 470. In one embodiment, the guard structure 440 may be a deep well region of a second conductivity type (e.g., N well). The guard structure 440 is electrically floating because it is an N-type well in a P-type substrate. The guard structure 440 is formed by an ion implantation process known in the art and has a doping concentration that is in a range, for example, from about $5 \times 10^{15}$ atoms/centimeter$^3$ to about $1 \times 10^{16}$ atoms/centimeter$^3$. Since the guard structure 440 is higher doped, it provides lower resistivity. In addition, the guard structure 440 extends vertically to the substrate 410 and has a depth approximately ranging from about 10 to about 25 microns. The width of the guard structure 440 is about 25 µm.

Figure 5A:
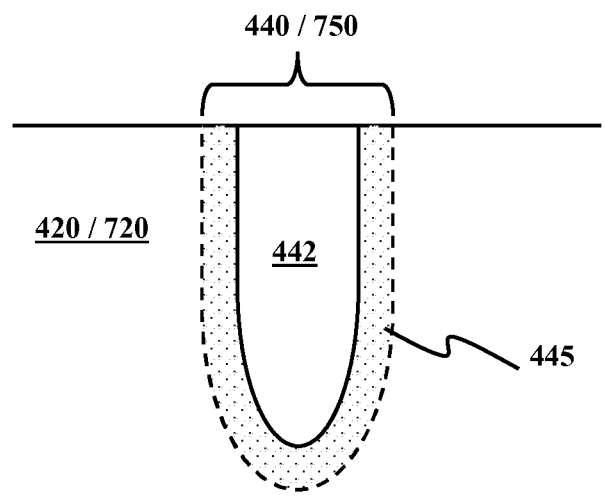
FIGS. 5A-5B are cross-sectional views of a guard structure in accordance with the present disclosure.
Figure 5B:
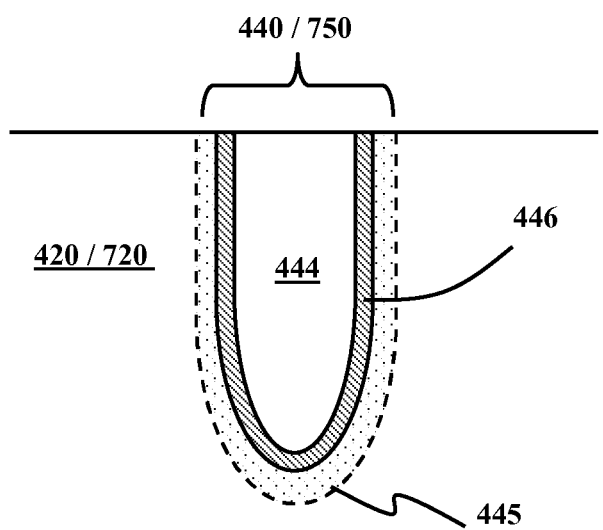

Alternatively, as shown in FIG. 5A, the guard structure 440 may be a trench filled with an insulating material 442, such as oxide. In another example as shown in FIG. 5B, the guard structure 440 may be a trench filled with a conductive material 444, such as polysilicon. The conductive material 444 may be biased or floating for field shaping. The trench of FIG. 5B is lined with an insulating material 446 such as oxide so that the guard structure 440 is insulated from the epitaxial layer 420. The trench of FIGS. 5A and 5B may be optionally surrounded by an N-type doping material 445 (shown in dashed line). The guard structure 440 in the embodiment of FIG. 5A or 5B is also electrically floating because it is insulated from the epitaxial layer 420.

Figure 2A:
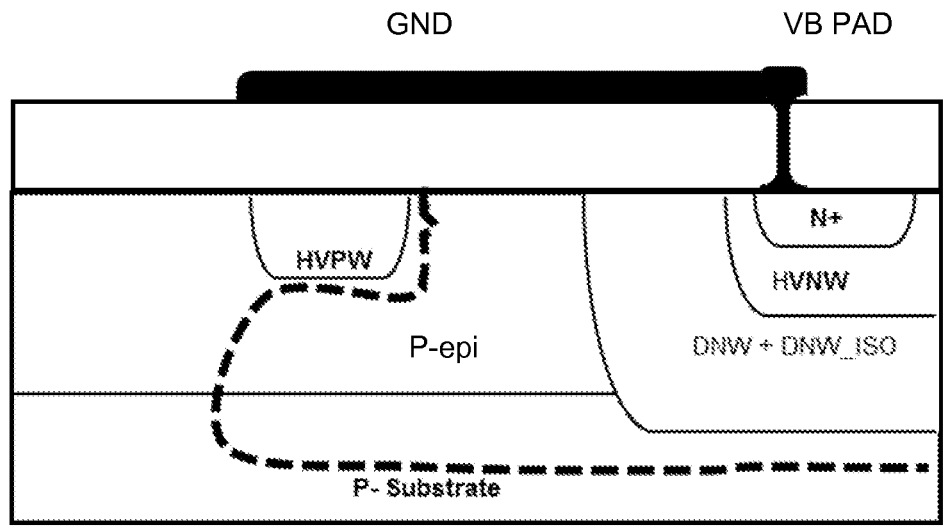
FIGS. 2A and 2B are cross-sectional view of a conventional high voltage gate driver integrated circuit fabricated using a P-epi process.

Comparing to FIG. 2A, the depletion shown in dashed line in FIG. 4 does not curve and instead wraps around the guard structure 440 and thus reducing the electric field. As such, no snapback occurs and the breakdown voltage gets improved with the embodiment of the present disclosure. The guard structure 440 is preferably deep in depth, which may result in better smoothing of the field distribution and less reduction of the breakdown voltage. In one embodiment, more than one guard structure 440 may be disposed between the two high-voltage doped wells 450 for higher voltage across the interconnect structure 470. Alternatively, a high-voltage doped well 450 may be disposed between two guard ring structures 440 or there may be multiple alternating doped wells 440 and guard ring structures 450.

Figure 6:
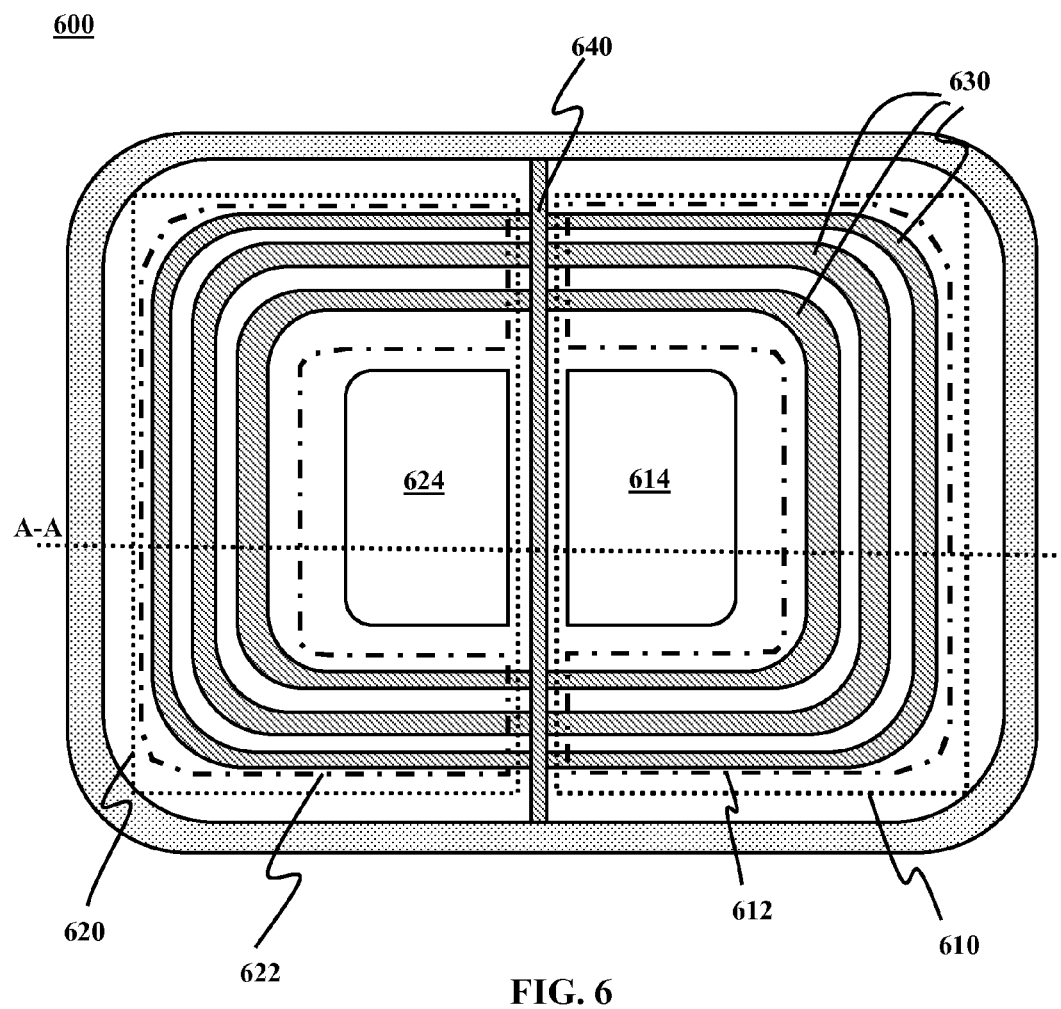
FIG. 6 is a top view of a high voltage integrated circuit in accordance with one embodiment of the present disclosure.

FIG. 6 in a top view of high voltage integrated circuit according to an embodiment where the level shifter is provided in the high voltage circuit region and the voltage different between the level shifter and the driver circuit is less than about 100 volts (e.g., 50 volts). The high voltage integrated circuit 600 includes a driver circuit 610 and a level shifter 620 in a high voltage circuit region. The driver circuit 610 may include a top region of the first conductivity type 612, a contact region 614 in a HVNW region, and a HVPW region (not shown). The level shifter 620 may include a top region of the first conductivity type 622 and a drain region 624 in a DNW region. A floating guard structure 640 is disposed between the contact region of the driver circuit 610 and the drain region of the level shifter 620. Each of the top region 612 and 622 is in a shape like "C" and is disposed symmetrically around the floating guard structure 640.

The driver circuit 610 and the level shifter 620 are electrically isolated from low voltage circuit region and surrounded by a common termination structure 630 (e.g., a junction termination structure). In one embodiment, the termination structure 630 may include one or more rings of trenches that are lined with insulating material and filled with electrically conductive material, such as polysilicon. For example, the termination structure 630 may include rings of a gate poly, a first and second metal field plates. As shown in FIG. 6, the rings of poly and metal go all around both the driver circuit 610 and the level shifter 620. In thus embodiment, the LDMOS level shifter is used as the termination for the driver circuit (HS tub) to allow ease of merging the LDMOS with the HS tub with the low voltage circuitry. In an alternative embodiment, the termination structure 630 may have rings of trenches lined with doped implant or poly.

Figure 7:
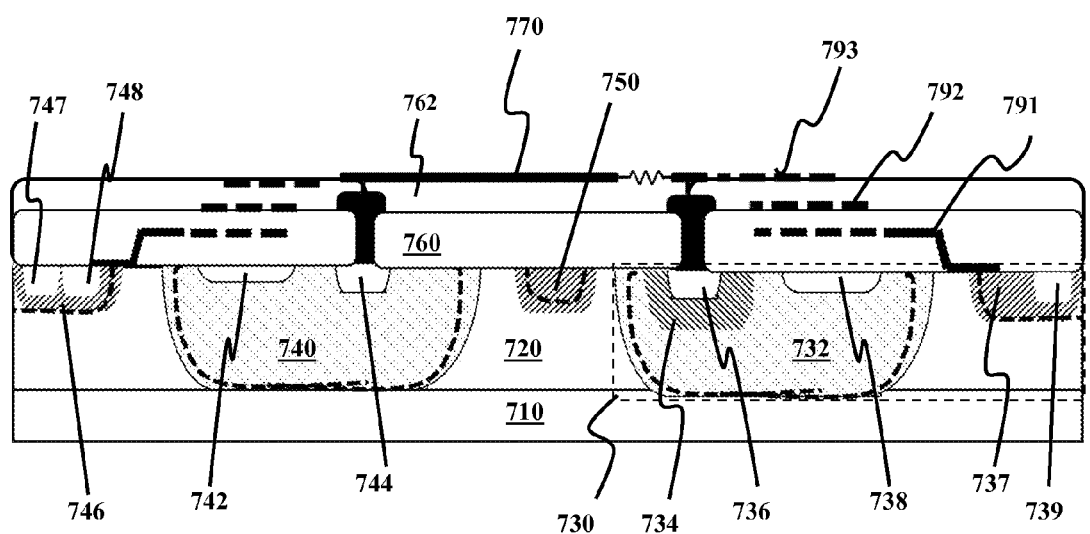
FIG. 7 is a cross-sectional view of a high voltage integrated circuit in accordance with one embodiment of the present disclosure.

FIG. 7 is a cross-sectional view of a high voltage integrated circuit along line A-A according to one embodiment of the present disclosure. The integrated circuit 700 includes a substrate 710 of a first conductivity type semiconductor (e.g., P-type substrate). An epitaxial layer 720 of the first conductivity type (e.g., P-type epitaxial layer) is formed over the P-type substrate 710. The epitaxial layer 720 is lightly doped. In one example, the epitaxial layer 720 may be formed by an epitaxial growth process as known in the art. The epitaxial layer 720 is lightly doped and may have a doping concentration that is in a range from about $1 \times 10^{14}$ atoms/centimeter$^3$ to about $1 \times 10^{15}$ atoms/centimeter$^3$.

A driver circuit is formed in the epitaxial layer 720. As discussed in connection with the driver circuit 430 of FIG. 4 above, the driver circuit may include a deep well region 732 of the second conductivity type (e.g., N deep well), a high voltage N doped well region 734 and a heavily N doped region 736. In addition, the driver circuit may include a top region of the first conductivity type 738 in the deep well region 732, a heavily P doped region 739 in a high voltage P doped well region 737. The details of these regions will not be repeated.

A level shifter (e.g., a LDMOS transistor device) may include a deep well region 740 of the second conductivity type (e.g., N deep well) formed in the semiconductor layer 720. The deep well region 740 may be formed by an ion implantation process known in the art. In one example, the deep well region 740 has a doping concentration that is in a range from about $1 \times 10^{15}$ atoms/centimeter$^3$ to about $5 \times 10^{16}$ atoms/centimeter$^3$. The deep well region 740 extends vertically to the P substrate 710 and has a depth ranging from about 12 µm to 15 µm, and is typically about 13 µm in depth. The level shifter also includes a top region 742 of the first conductivity type (e.g., P top region) and a drain region 744 of the second conductivity type formed in the top portion of the deep well region 740. In one example, the top region 742 and the drain region 744 may be formed by an ion implantation process known in the art. As an example, the top region 742 may have a dose that is in a range from about $5 \times 10^{11}$ atoms/centimeter$^2$ to about $1 \times 10^{13}$ atoms/centimeter$^2$. The top region 742 extends vertically to a depth in a range from about 1.4 µm to 1.9 µm, and is typically about 1.65 µm in depth. As an example, the drain region 744 may have a doping concentration that is in a range from about $1 \times 10^{18}$ atoms/centimeter$^3$ to about $5 \times 10^{20}$ atoms/centimeter$^3$. The drain region 744 may extends vertically to a depth in a range from about 0.2 µm 0.3 µm, and is typically about 0.25 µm in depth.

An interconnect structure 770 is electrically coupled to the driver circuit 730 at one end and coupled to the drain region 744 of the level shifter at the other end. The interconnect structure 770 is made of an electrically conductive material. The interconnect structure is at a voltage ranging from about 0 volts to about 1250 volts. The interconnect structure 770 is formed over an insulating layer 760 made from a dielectric material as an example. As shown in FIG. 7, the gate poly layer 791, the first metal layer 792 and the second metal layer 793 lined with insulating materials (e.g., insulating layers 760 and 762) are disposed over the top surface of the high voltage circuit region and formed as a part of the common termination structure to isolate the driver circuit and the level shifter from low voltage circuit region.

Between the driver circuit 730 and the level shifter, a floating guard structure 750 is formed in the epitaxial layer 720. As an example, the guard structure 750 is in a distance of about 10 µm away from the driver circuit 730 and in about the same distance away from the level shifter. At least one portion of the guard structure 750 are under the interconnect structure 770.

In one embodiment, the guard structure 750 may be a well region of a first conductivity type (e.g., P well). The guard structure 750 is formed by an ion implantation process know in the art and has a doping concentration that is in a range, for example, from about $1 \times 10^{16}$ atoms/centimeter$^3$ to about $5 \times 10^{16}$ atoms/centimeter$^3$. The guard structure 750 extends vertically to a depth approximately in a range from about 3.5 µm to 4.5 µm, and is typically about 4 µm in depth. The width of the guard structure 750 can be varied to make it partially depleted to fully depleted. In one example, the width of the guard structure 750 is about 2.5 µm. In addition, the guard structure 750 is connected to ground in the third dimension but it is electrically floating between the driver circuit 730 and the drain region 744 of the level shifter.

Alternatively, as shown in FIG. 5A, the guard structure 750 may be a trench filled with an insulating material 442, such as oxide. In another example as shown in FIG. 5B, the guard structure 750 may be a trench filled with a conductive material 444, such as polysilicon. The trench of FIG. 5B is lined with an insulating material 446 such as oxide so that the guard structure 750 is insulated from the epitaxial layer 720. The trench of FIGS. 5A and 5B may be optionally surrounded by an N-type doping material 445 (shown in dashed line in FIGS. 5A-5B).

The level shifter further includes a high voltage doped well 746 of the first conductivity type (e.g., high voltage P well). The high voltage doped well 746 may be formed by an ion implantation process known in the art. The high voltage doped well 746 extends vertically to a depth approximately in a range from about 3.5 µm to 4.5 µm, and is typically about 4 µm in depth. In the high voltage doped well 746, there are a heavily doped well 747 of the first conductivity type and a heavily doped well 748 of the second conductivity type to form the source region of the level shifter. These two heavily doped well 747, 748 may be formed by an ion implantation process known in the art and each extends vertically to a depth approximately in a range from about 0.2 µm to 0.3 µm, and is typically about 0.25 µm in depth.

Figure 2B:
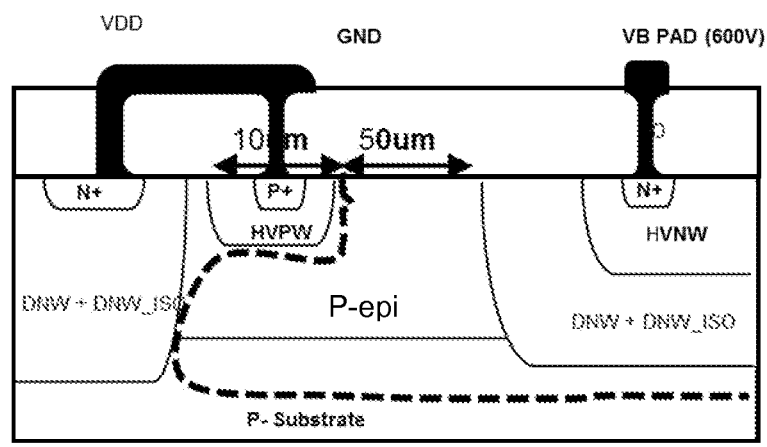

Comparing to FIG. 2B, the depletion as shown in dashed lines in FIG. 7 do not curve and actually wrap around the guard structure. Also the guard structure 750 prevents leakage because the guard structure 750 is not fully depleted but floats. Thus, its surface doping is adjusted to give a field threshold adequate or high enough not to form a surface inversion caused by the metal cross over. In one embodiment, more than one guard structure 750 may be disposed between the driver circuit 730 and the level shifter.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An integrated circuit, comprising:
   a substrate of a first conductivity type semiconductor;
   a lightly doped semiconductor layer of the first conductivity type semiconductor disposed over the substrate;
   a driver circuit including a first doped region of a second conductivity type semiconductor disposed in the semiconductor layer;
   an electrically conductive interconnect structure formed over the semiconductor layer and electrically connected to the driver circuit at one end;
   at least one guard structure formed in the semiconductor layer and under the interconnect structure, wherein the at least one guard structure is electrically floating; and
   a well region of the first conductivity type semiconductor formed in a top portion of the semiconductor layer and under the interconnect structure, wherein the well region is disposed between the driver circuit and the at least one guard structure and wherein the well region is doped heavier than the semiconductor layer.

2. The integrated circuit of claim 1, wherein the at least one guard structure includes a region of the second conductivity type semiconductor formed in the semiconductor layer of the first conductivity type semiconductor.

3. The integrated circuit of claim 1, wherein the at least one guard structure includes a trench filled with a conductor material, that is electrically isolated from the semiconductor layer of the first conductivity type semiconductor.

4. The integrated circuit of claim 1, wherein the at least one guard structure includes a trench filled with an insulating material.

5. The integrated circuit of claim 1 further comprising an insulating layer formed between the interconnect structure and the semiconductor layer of the first conductivity type semiconductor.

6. The integrated circuit of claim 1, wherein the driver circuit further includes a second well region of the second conductivity type semiconductor in the first doped region and a second doped region of the second conductivity type semiconductor in the second well region.

7. The integrated circuit of claim 1, wherein the first conductivity type semiconductor is a P-type semiconductor and the second conductivity type semiconductor is an N-type semiconductor.

8. The integrated circuit of claim 1, wherein the first conductivity type semiconductor is an N-type semiconductor and the second conductivity type semiconductor is a P-type semiconductor.

9. The integrated circuit of claim 1, wherein the interconnect structure is at high voltage in a range from about 120 volts to about 1200 volts.

10. The integrated circuit of claim 1, wherein the interconnect structure has a second end that is electrically connected to a drain region of a level shifter.

11. The integrated circuit of claim 1, wherein the at least one guard structure has a doping concentration that is in a range from about $5 \times 10^{15}$ atoms/centimeter$^3$ to about $1 \times 10^{16}$ atoms/centimeter$^3$.

12. An integrated circuit, comprising:
   a substrate of a first conductivity type semiconductor;
   a lightly doped semiconductor layer of the first conductivity type semiconductor disposed over the substrate;
   a driver circuit including a first doped region of a second conductivity type semiconductor disposed in the semiconductor layer;
   a level shifter including a second doped region of the second conductivity type semiconductor disposed in the semiconductor layer and a drain region in the second doped region, wherein the drain region of the level shifter is electrically connected to the driver circuit by an electrically conductive interconnect structure;
   a termination structure, wherein the termination structure surrounds both the driver circuit and the level shifter, whereby the driver circuit and level shifter are located within the same termination structure; and
   at least one guard structure formed in the semiconductor layer between the driver circuit and the level shifter and under the interconnect structure, wherein the at least one well region is electrically floating.

13. The integrated circuit of claim 12, wherein the at least one guard structure includes a region of the first conductivity type semiconductor formed in the semiconductor layer of the first conductivity type semiconductor.

14. The integrated circuit of claim 12, wherein the at least guard structure includes a trench filled with a conductor material, that is electrically isolated from the semiconductor layer of the first conductivity type semiconductor.

15. The integrated circuit of claim 12, wherein the at least one guard structure includes a trench filled with an insulating material.

16. The integrated circuit of claim 12 further comprising an insulating layer formed between the interconnect structure and the semiconductor layer of the first conductivity type semiconductor.

17. The integrated circuit of claim 12, wherein the driver circuit further includes a well region of the second conductivity type semiconductor in the first doped region and a third doped region of the second conductivity type semiconductor in the second well region.

18. The integrated circuit of claim 12, wherein the interconnect structure is at high voltage in a range from about 120 volts to about 1200 volts.

19. The integrated circuit of claim 12, wherein the at least one guard structure has a doping concentration that is in a range from about $1 \times 10^{16}$ atoms/centimeter$^3$ to about $5 \times 10^{16}$ atoms/centimeter$^3$.

20. The integrated circuit of claim 12, wherein the driver circuit and the drain region of the level shifter are disposed in a high voltage circuit region and separated from a low voltage circuit region by an insulating structure.

* * * * *